(12) United States Patent
Eichmann

(10) Patent No.: US 6,387,543 B1
(45) Date of Patent: May 14, 2002

(54) PROTECTING LAYER

(75) Inventor: Wolfgang Eichmann, Puchheim (DE)

(73) Assignee: MTU Aero Engines GmbH, Munich (DE)

(*) Notice: Subject to any disclaimer, the term of this patent is extended or adjusted under 35 U.S.C. 154(b) by 0 days.

(21) Appl. No.: 09/622,251

(22) PCT Filed: Nov. 16, 1999

(86) PCT No.: PCT/DE99/03636

§ 371 Date: Aug. 15, 2000

§ 102(e) Date: Aug. 15, 2000

(87) PCT Pub. No.: WO00/37709

PCT Pub. Date: Jun. 29, 2000

(30) Foreign Application Priority Data

Dec. 19, 1998 (DE) .......................................... 198 58 913

(51) Int. Cl.$^7$ .................. B32B 15/01; B32B 15/18; B32B 15/20

(52) U.S. Cl. .................. 428/675; 428/660; 428/668; 428/676; 428/680; 428/685; 428/674; 416/241 R; 416/204 R

(58) Field of Search .................. 416/241 R, 204 R; 420/489, 495, 496; 428/660, 668, 675, 676, 680, 685

(56) References Cited

U.S. PATENT DOCUMENTS

| 4,358,167 A | * | 11/1982 | Magazian et al. | ............ 308/78 |
|---|---|---|---|---|
| 4,994,235 A | | 2/1991 | Shirosaki et al. | |
| 5,312,696 A | | 5/1994 | Beers et al. | |
| 5,580,669 A | * | 12/1996 | Beers et al. | ................ 428/660 |
| 6,089,828 A | * | 6/2000 | Hollis et al. | ............ 416/219 R |

FOREIGN PATENT DOCUMENTS

| DE | 703304 | 2/1941 |
|---|---|---|
| DE | 4229600 | 11/1993 |

OTHER PUBLICATIONS

Belous, M. V. et al.; "Some Properties of Films obtained by Vacuum Condensation of Aluminum, Nickel, Cobalt, Copper, and the Alloy Cu–Cr–Al", English Translation pp. 1060 to 1063 of Golden–Jubilee–of–October Kiev Polytechnical Institute, Soviet Physics Journal, USA, Nov. 1, 1973. Translated from Izvestiya Vysshikh Uchebnykh Zavedenii, Fizika, No. 8, pp. 52–56, Aug., 1971.

Sidorenko, S.I. et al., "Electrophysical Properties and Phase Compositions of Cu–Cr–Al Alloy", Russian Metallurgy, UK, Nr. 3, pp. 167–169, 1983; translated from Izvestiya Akademii Nank SSSR, Metally, 1983, Nr. 3, pp. 189–192 (no month).

* cited by examiner

Primary Examiner—Deborah Jones
Assistant Examiner—Andrew T Piziali
(74) Attorney, Agent, or Firm—W. F. Fasse; W. G. Fasse

(57) ABSTRACT

A protective layer for load-transferring contact surfaces of gas turbine components, especially titanium turbine components is capable to take up alternating loads at higher temperatures. The protective layer is formed of an alloy having the following composition in percent by weight: aluminum (Al) 4–8%; chromium (Cr) 2–5%; iron (Fe) 0–3.5%; and copper (Cu) remainder.

5 Claims, No Drawings

PROTECTING LAYER

FIELD OF THE INVENTION

The invention concerns a protective layer for load-transferring contact surfaces of gas turbine components made of alloys based on titanium, nickel, cobalt or iron against friction wear, friction corrosion and/or friction fatigue.

BACKGROUND INFORMATION

The surfaces of component pairs with positive fit in gas turbine power plants, especially in the area of rotating blade foot/disk groove, tend to undergo fretting wear, i.e., friction corrosion or friction wear when oscillating at high frequencies at low amplitudes and at high temperatures. Temperatures above approximately 450° C. strongly accelerate wear. In bad cases, cracks caused by fretting fatigue, i.e., friction fatigue, can lead to premature failure of the component.

U.S. Pat. No. 5,312,696 (Beers et al.) discloses a protective layer against fretting wear for components made of nickel, cobalt or titanium alloys, which protective layer consists of copper and aluminum, possibly with silicon as an additional alloy element. The percent by weight of these alloy elements lies within the following ranges:

| | |
|---|---|
| Cu | 88–96% |
| Al | 4–8% |
| Si | 0–4% |

Preferred compositions of these aluminum bronzes without added silicon contain 92% Cu and 8% Al or 92.5% Cu and 7.5% Al. It was shown that layers According to this U.S. Patent possess sufficient high-temperature oxidation resistance, however their heat resistance drops drastically above 450° C. The surface pressure at the blade foot/disc groove eats away such layers from the contact zone and causes them to fail (cake dough effect).

German Patent 42 29 600 C1 (Grunke et al.) concerns a layer structure for titanium components with a metal intermediate layer and outer protective layer. The latter is formed by a copper/aluminum alloy or other alloys, preferably with a composition of $CuAl_8$. Apart from the additionally requited intermediate layer, the same considerations apply to the cover layer of aluminum bronze as discussed above with reference to the U.S. Patent. The other alloys for alternative protective/cover layers are not bronzes, i.e. not copper alloys, and will therefore not be further discussed in this context.

SUMMARY OF THE INVENTION

In view of the above prior art protective layers and their disadvantages, the problem of the invention is to present a protective layer based on a copper/aluminum alloy for load-transferring contact surfaces of components, especially titanium components that strongly resist oxidation, corrosion and friction wear, especially at temperatures above 450° C., that is therefore particularly useful in gas turbine drives.

This problem is solved by the present protective layer formed by an alloy that contains copper as the main element and aluminum and chromium as additional elements. Iron as an additional element can further improve the protective properties. The element chromium (Cr) with 2–5% parts by weight particularly increases the heat resistance and the high-temperature oxidation resistance while simultaneously leaving the protective layer sufficiently ductile. More specifically, according to the invention there is provided a gas turbine component for operation at temperatures above at least 450° C., said gas turbine component comprising a base structure made of alloys made of alloying elements selected from the group consisting of titanium, nickel, cobalt and iron, said base structure comprising a contact surface for cooperation with other turbine components, said gas turbine component further comprising a protecting layer on said contact surface for protection against fretting, wherein said protecting layer is made of an alloy consisting of aluminum 4 to 8% by wt., chromium 2 to 5% by wt., iron 0 to 3.5% by wt., the remainder being copper plus unavoidable impurities.

DETAILED DESCRIPTION OF PREFERRED EXAMPLE EMBODIMENTS AND OF THE BEST MODE OF THE INVENTION

The preferred chromium content in the above example is 3% by weight.

A range of 20–50 µm is advantageous for the layer thickness.

It is convenient to deposit the protective layer by physical vapor deposition (PVD). The method of cathode sputtering is preferred. In this method, a cathode consisting of the protective layer alloy is removed by the sputter effect in a glow discharge, and the arising metal vapor is deposited on the component, e.g. a compressor rotor blade of a gas turbine.

The protective layer according to the invention has proven itself well in experiments.

Although the invention has been described with reference to specific example embodiments, it will be appreciated that it is intended to cover all modifications and equivalents within the scope of the appended claims. It should also be understood that the present disclosure includes all possible combinations of any individual features recited in any of the appended claims.

What is claimed is:

1. A gas turbine component for operation at temperatures above at least 450° C., said gas turbine component comprising an alloy base structure made of alloying elements selected from the group consisting of titanium, nickel, cobalt and iron, said alloy base structure comprising a contact surface for cooperation with other turbine components, said gas turbine component further comprising a protecting layer on said contact surface for protection against fretting, wherein said protecting layer is made of an alloy consisting of aluminum 4 to 8% by wt., chromium 2 to 5% by wt., iron 0 to 3.5% by wt., the remainder being copper plus unavoidable impurities.

2. The gas turbine component of claim 1, wherein said chromium is present at 3% by wt.

3. The gas turbine component of claim 1, wherein said protecting layer has a thickness within the range of 20 to 50 µm.

4. The gas turbine component of claim 1, wherein said protecting layer is a physical vapor deposition layer.

5. The gas turbine component of claim 4, wherein said protecting layer is a cathode sputtering layer.

* * * * *